(12) United States Patent
Takabayashi et al.

(10) Patent No.: US 12,300,973 B2
(45) Date of Patent: May 13, 2025

(54) INTEGRATED PHOTONIC DEVICE AND PHOTONIC INTEGRATED CIRCUIT USING THE SAME

(71) Applicant: Fujitsu Optical Components Limited, Kawasaki (JP)

(72) Inventors: Kazumasa Takabayashi, Atsugi (JP); Shuntaro Makino, Kawasaki (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 1031 days.

(21) Appl. No.: 17/323,616

(22) Filed: May 18, 2021

(65) Prior Publication Data

US 2021/0384709 A1    Dec. 9, 2021

(30) Foreign Application Priority Data

Jun. 3, 2020   (JP) .................................. 2020-097163

(51) Int. Cl.
*H01S 5/40* (2006.01)
*H01S 5/50* (2006.01)

(52) U.S. Cl.
CPC ............... *H01S 5/4025* (2013.01); *H01S 5/50* (2013.01); *H01S 5/5027* (2013.01)

(58) Field of Classification Search
CPC ......... H01S 5/5027; H01S 5/4025; H01S 5/50
See application file for complete search history.

(56) References Cited

U.S. PATENT DOCUMENTS

| 6,186,631 | B1* | 2/2001 | Behringer | ............. | H01S 5/5027 |
| | | | | | 359/344 |
| 8,637,869 | B2 | 9/2014 | Akutsu et al. | | |
| 2003/0067675 | A1* | 4/2003 | Wang | ..................... | B82Y 20/00 |
| | | | | | 359/344 |

(Continued)

FOREIGN PATENT DOCUMENTS

JP    2008-250019    10/2008

OTHER PUBLICATIONS

Hasegawa et al., "Polarization independent operation of U-turn shape semiconductor optical amplifier by using PLC-based polarization diversity circuit," 2011 37th European Conference and Exhibition on Optical Communication, Geneva, 2011, pp. 1-3. (Year: 2011).*

(Continued)

*Primary Examiner* — Yuqing Xiao
*Assistant Examiner* — Zhengqing Qi
(74) *Attorney, Agent, or Firm* — STAAS & HALSEY LLP

(57) ABSTRACT

An integrated photonic device having an array of two or more semiconductor optical amplifiers includes a first semiconductor optical amplifier, which has a first gain region and a second gain region connected by a first connecting waveguide, and a second semiconductor optical amplifier, which is provided in parallel with the first semiconductor optical amplifier and has a third gain region and a fourth gain region connected by a second connecting waveguide. The first gain region and the second gain region are provided on an outer side of the third gain region and the fourth gain region. The first connecting waveguide is configured to connect the first gain region and the second gain region on the outer side of the second connecting waveguide.

9 Claims, 12 Drawing Sheets

(56) References Cited

U.S. PATENT DOCUMENTS

2008/0240645 A1 10/2008 Funabashi et al.
2013/0121632 A1* 5/2013 Akutsu ................ G02B 6/1228
                                                         385/11

OTHER PUBLICATIONS

Mathur et al., "Polarization insensitive strained quantum well gain medium for lasers and optical amplifiers," Applied Physics Letters, vol. 61, Issue 24, Dec. 14, 1992, pp. 2845-2847. (Year: 1992).*

* cited by examiner

INTEGRATED PHOTONIC DEVICE AND PHOTONIC INTEGRATED CIRCUIT USING THE SAME

CROSS-REFERENCE TO RELATED APPLICATIONS

This application is based upon and claims priority to earlier Japanese Patent Application No. 2020-097163 filed Jun. 3, 2020, which is incorporated herein by reference in its entirety.

FIELD

The present disclosure relates to an integrated photonic device and a photonic integrated circuit in which the integrated photonic device is incorporated.

BACKGROUND

In an optical communication system, a photonic integrated circuit (IC) module is used for optical transmission and reception. In a photonic IC that includes an optical transmitter circuit, a higher light output level is required to compensate for insertion loss, and an optical amplifier is generally used. On the other hand, further downsizing of photonic ICs is strongly demanded. In use of an optical amplifier, a configuration in which a small chip-sized semiconductor optical amplifier (SOA) is incorporated in a photonic IC is promising.

With a typical SOA, light is input from one end face of the SOA chip, and output from the other end face. When such an SOA is placed in the groove formed in the photonic IC, the distance (or gap) between the SOA and the optical waveguide formed in the photonic IC is not small due to the variation in the SOA chip length, and therefore, the optical coupling loss tends to increase.

A U-shaped SOA illustrated in FIG. 1 has been proposed (see, for example, Patent Document 1). This type of SOA is called a U-turn SOA because two parallel SOAs are connected via a U-shaped passive optical waveguide. Because the light input end and the light output end are positioned on the same side, the input/output end faces of the SOA can be brought to be as close as possible to the side wall of the groove (labelled as "T" in the figure) formed in the photonic IC, without need of concern with the variation in the SOA chip length. The gap between the end faces of the SOA chip and the side wall of the groove T is reduced, and optical coupling loss is reduced.

As illustrated in FIG. 2, an array configuration in which multiple U-turn SOAs are arranged in parallel has also been proposed (see, for example, Patent Document 2).

If the U-turn SOA array illustrated in FIG. 2 is mounted on a photonic IC, the routing of the optical waveguide connected to the U-turn SOA in the photonic IC becomes complicated or redundant. Intersection or crossing of optical waveguides inevitably occurs in the photonic IC. Due to redundancy or intersection of optical waveguides, excessive optical loss or undesired optical crosstalk may occur.

RELATED PUBLICATIONS

Patent Document 1: U.S. Pat. No. 8,837,869
Patent Document 2: Japanese Patent Application Laid-open Publication No. 2008-250019

SUMMARY

According to one aspect of the disclosure, an integrated photonic device having an array of two or more semiconductor optical amplifiers is provided. The integrated photonic device includes a first semiconductor optical amplifier, which has a first gain region and a second gain region connected by a first connecting waveguide, and a second semiconductor optical amplifier, which is provided in parallel with the first semiconductor optical amplifier and has a third gain region and a fourth gain region connected by a second connecting waveguide. The first gain region and the second gain region are provided on an outer side of the third gain region and the fourth gain region, and the first connecting waveguide is configured to connect the first gain region and the second gain region on the outer side of the second connecting waveguide.

The object and advantages of the invention will be realized and attained by means of the elements and combinations particularly pointed out in the claims. It is to be understood that both the foregoing general description and the following detailed description are exemplary and explanatory and are not restrictive to the invention as claimed.

DESCRIPTION OF EMBODIMENTS

Before the configurations of an integrated photonic device and a photonic IC using the integrated photonic device of embodiments are explained, the technical problems which will arise when a conventional U-turn SOA array is used is described in more detail.

Figure 1:
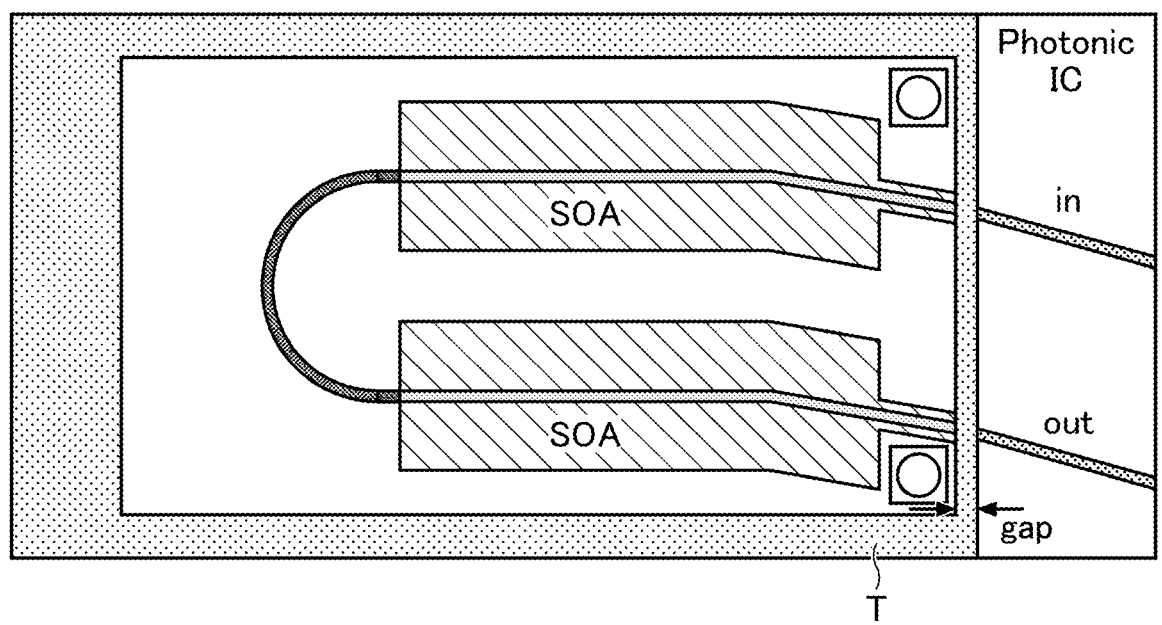
FIG. 1 is a schematic diagram of a typical U-turn SOA.
Figure 2:
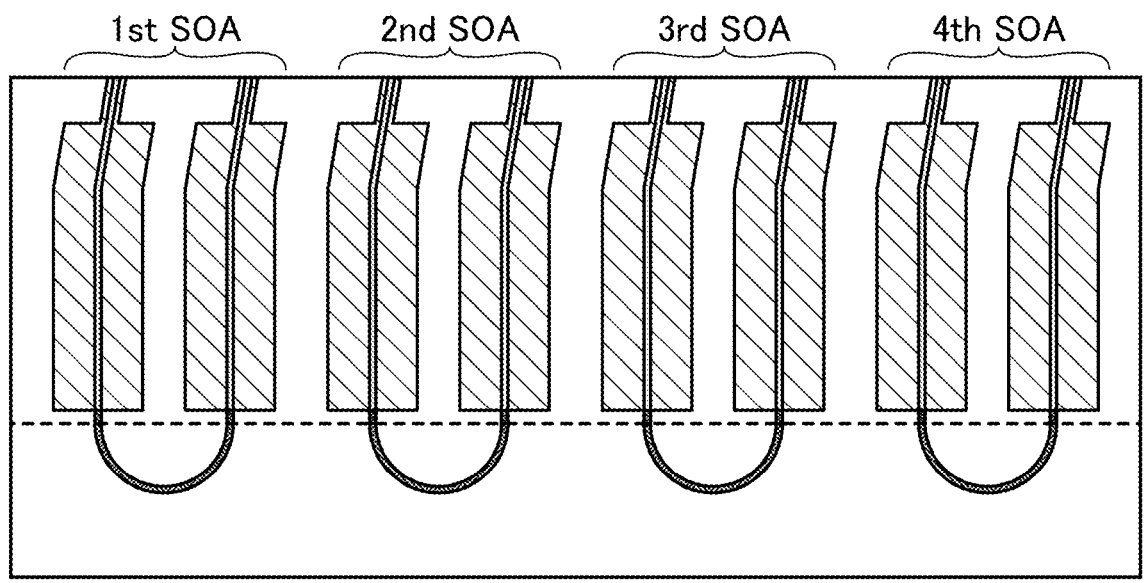
FIG. 2 is a schematic diagram of an SOA array in which a plurality of U-turn SOAs are arranged in parallel.
Figure 3A:
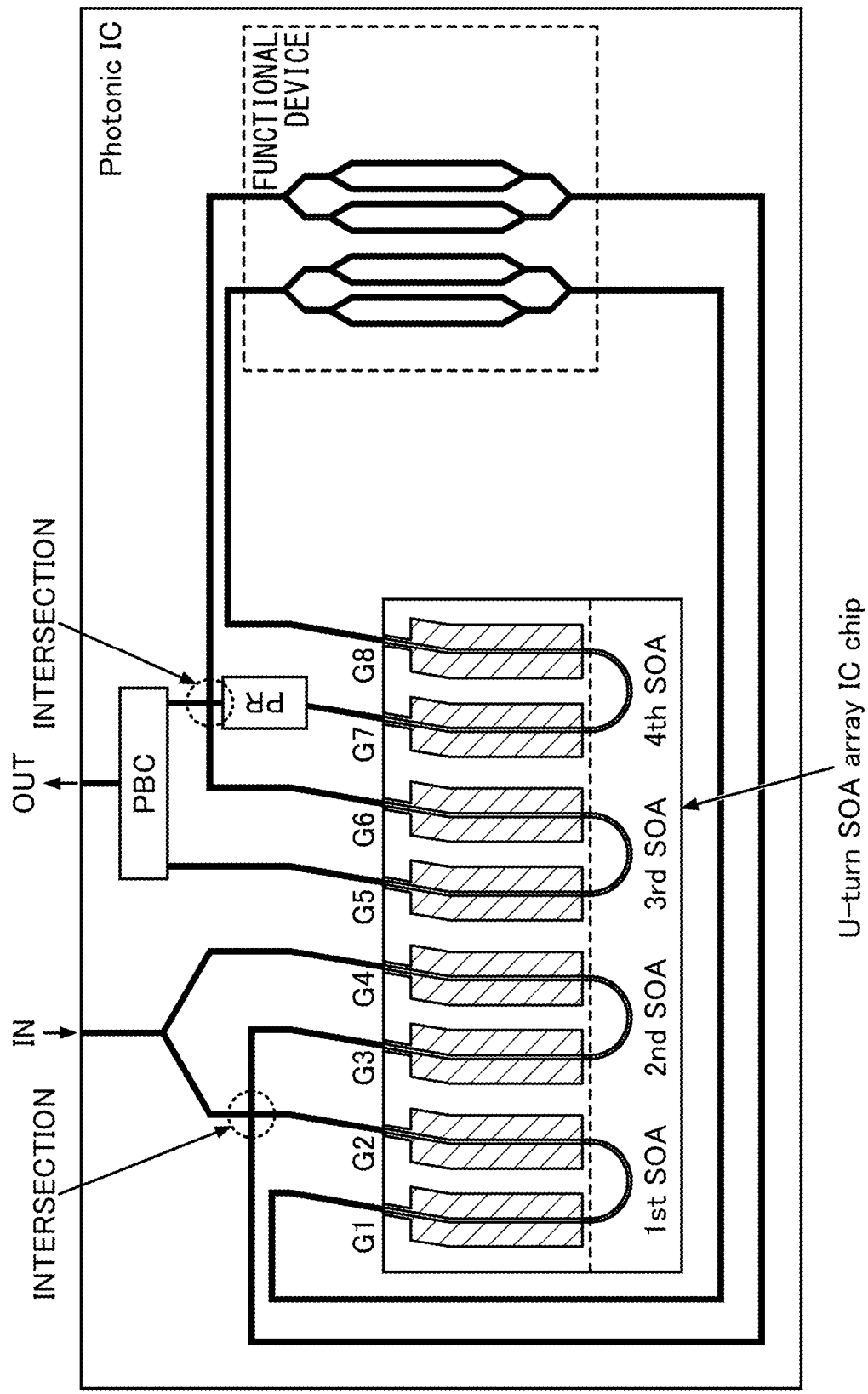
FIG. 3A illustrates a technical problem arising in the conventional U-turn SOA array.

In FIG. 3A, a U-turn SOA array chip is mounted in a photonic IC in which a functional optical device is formed. In this example, the functional optical device is a Mach-Zehnder (MZ) type optical modulator. The optical modulator has two IQ modulators of nested MZ interferometers arranged in parallel, which performs dual-polarization quadrature phase shift keying (DP-QPSK) for example.

Four U-turn SOAs are provided in parallel in the U-turn SOA array chip. In the first SOA, the areas including the gain waveguides G1 and G2 are connected by a U-shaped passive optical waveguide. In the second SOA, the areas including the gain waveguides G3 and G4 are connected by a U-shaped passive optical waveguide. In the third SOA, the areas including the gain waveguides G5 and G6 are connected by a U-shaped passive optical waveguide. In the fourth SOA, the areas including the gain waveguides G7 and G8 are connected by a U-shaped passive optical waveguide.

The incident light (IN) onto the photonic IC chip is split into two. The split light components are amplified by the first SOA and the second SOA, respectively, and supplied to the optical modulator. The light components output from the optical modulator are amplified by the 3rd SOA and the 4th SOA, respectively, and the plane of polarization of one of the amplified light components is rotated by 90 degrees by the polarization rotator (PR). Then, the two light components are combined by the polarization beam combiner (PBC) and output.

On the light incident side, the optical waveguide connected to the gain waveguide G2, which is located on the light input side of the first SOA, intersects with the optical waveguide connected to the gain waveguide G3, which is located on the light output side of the second SOA. On the optical signal output side, the optical waveguide connected to the gain waveguide G6, which is located on the light input side of the third SOA, and the optical waveguide connected to the gain waveguide G7, which is located on the light output side of the fourth SOA, intersect each other. Such intersections of optical waveguides cause optical crosstalk, and noise increases.

Figure 3B:
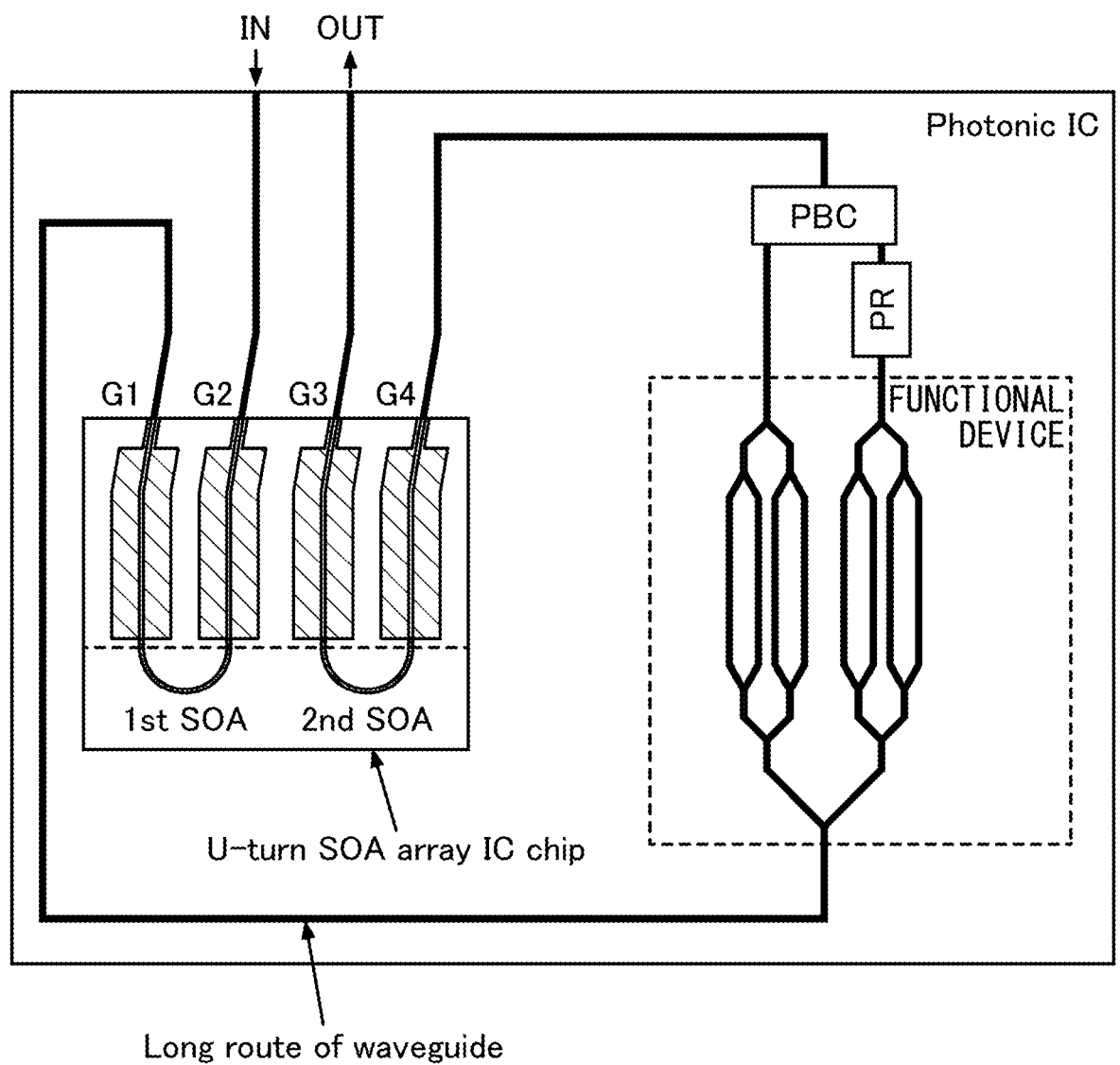
FIG. 3B illustrates a technical problem arising in the conventional U-turn SOA array.

FIG. 3B illustrates another problem of redundancy of optical waveguides. In this example, two sets of U-turn SOAs are arranged in parallel in the U-turn SOA array chip. An MZ optical modulator is formed as a functional optical device in the photonic IC to perform DP-QPSK modulation.

In order to avoid crossing of optical waveguides, the incident light (IN) onto the photonic IC chip is amplified by the first SOA and is supplied to the optical modulator by taking a detour around with respect to the U-turn SOA array. The plane of polarization of one of the modulated light components output from the respective IQ modulators is rotated by 90 degrees by the polarization rotator "PR" and combined with the other modulated light component at the polarization beam combiner "PBC". The combined modulated light is amplified by the second SOA and output from the photonic IC. In FIG. 3B, the optical waveguide that connects the gain waveguide G1 at the output end of the first SOA to the optical modulator is a long detour, and the total length of the optical waveguides becomes long. With this configuration, excessive optical loss occurs due to the redundancy of the optical waveguides.

To avoid intersection or detouring (redundancy) of the optical waveguides, it may be conceived to provide individual U-turn SOAs at locations where optical amplification is needed. However, a groove has to be formed in the photonic IC to accommodate each U-turn SOA, and the gain waveguide of each U-turn SOA has to be aligned with the optical waveguide on the photonic IC. This causes the substrate size of the photonic IC and the number of fabrication processes to increase. Integrating multiple U-turn SOAs in an array leads to lower manufacturing cost and smaller size of the total of the SOAs than fabricating individual U-turn SOA chips. Under strict requirements for downsizing of optical communication modules, increase of the photonic IC size due to SOAs is undesirable.

In the embodiments, intersection, redundancy or complexity of optical waveguides of a photonic IC is prevented by improving the layout of integrated U-turn SOAs. As a result, noise or optical loss due to optical crosstalk is suppressed, while suppressing increase in the chip size.

Configuration of Embodiment

Figure 4:
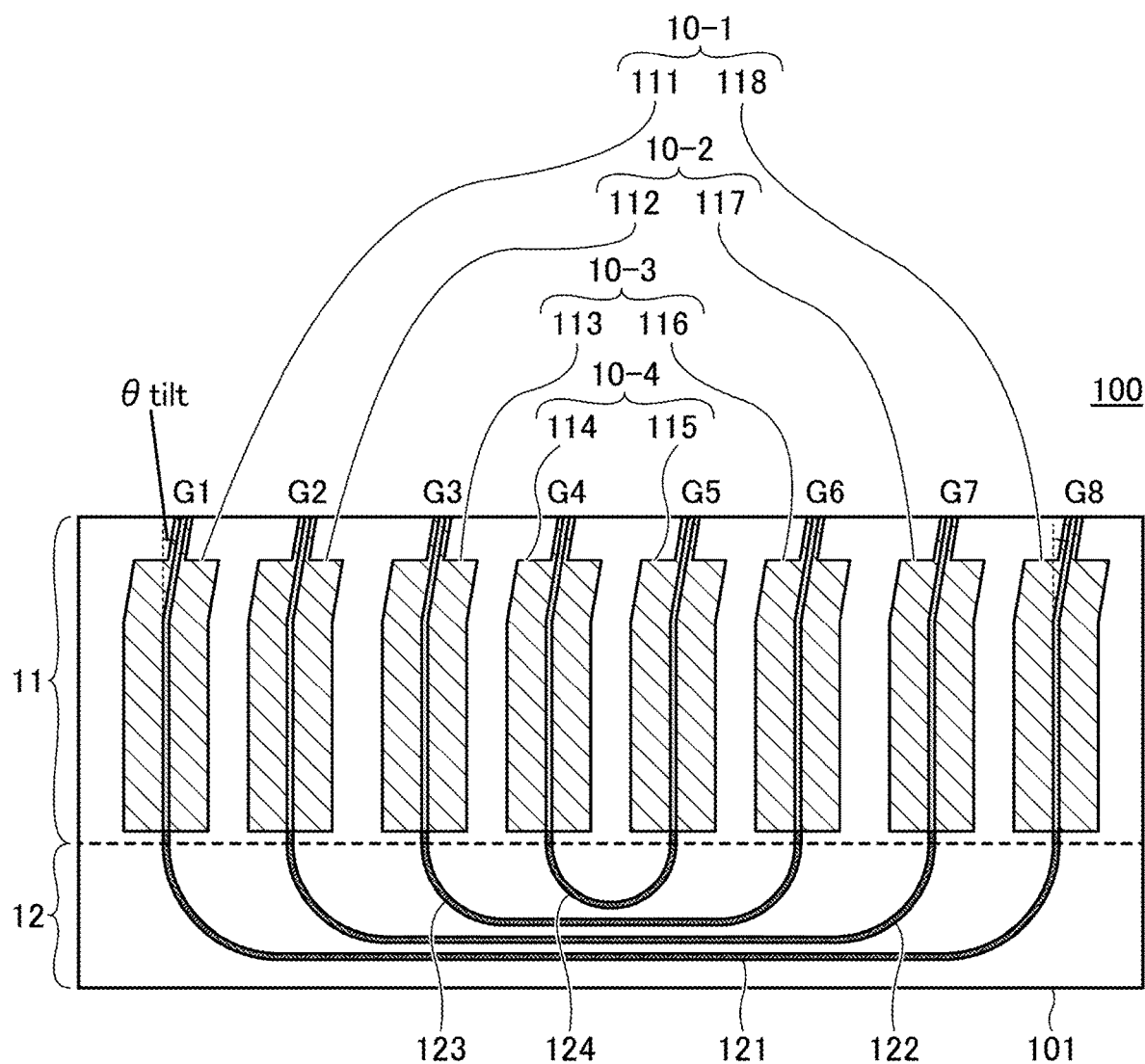
FIG. 4 is a schematic plan view of an integrated photonic device according to an embodiment.

FIG. 4 is a schematic plan view of an integrated photonic device 100 according to an embodiment. The integrated photonic device 100 has N U-turn SOAs 10-1 to 10-N (where N is an integer equal to or greater than 2) integrated onto a substrate 101. In this example, N equals 4, and U-turn SOAs 10-1 to 10-4 are integrated. In this specification and claims, the term "U-turn SOA" refers to an SOA having a pair of gain regions connected by a passive optical waveguide, in which the light incident end and the light emitting end are located on the same side.

The passive optical waveguide allows propagation of light, but does not have a function of optical amplification. In this sense, the passive optical waveguide may be referred to simply as an "optical waveguide" or a "connecting waveguide". In the following description, the passive optical waveguide is referred to as a "connecting waveguide" for the purpose of distinguishing the connecting waveguide from the optical waveguides formed on a photonic IC in which the integrated photonic device 100 is mounted.

The substrate 101 has a first area 11, in which gain regions 111 to 118 including gain waveguides G1 to G8 are formed, and a second area 12, in which connecting waveguides 121 to 124 are formed. The first area 11 is formed of a compound semiconductor for optical amplification. Injection electrodes may be provided to the gain regions 111 to 118 for current injection. The second area 12 is also formed of a compound semiconductor.

In the conventional U-turn SOA array, two adjacent gain regions are connected by the connecting waveguide to form a U-turn SOA.

In contrast, with the U-turn SOA 10 of the embodiment, a pair of gain regions is selected from the outermost or the innermost positions of the multiple gain regions 111 to 118 arranged in parallel, and connected by a connecting waveguide to form a U-turn SOA 10.

The gain waveguide G1 of the gain region 111 and the gain waveguide G8 of the gain region 118 located outermost are connected by the connecting waveguide 121 to form a U-turn SOA 10-1. The gain waveguide G2 of the gain region 112 and the gain waveguide G7 in the gain region 117 located the second outermost are connected by the connecting waveguide 122 to form a U-turn SOA 10-2.

The gain waveguide G3 of the gain region 113 and the gain waveguide G6 of the gain region 116 located the third outermost are connected by the connecting waveguide 123 to form a U-turn SOA 10-3. The gain waveguide G4 of the gain region 114 and the gain waveguide G5 of the gain region 115 located innermost are connected by the connecting waveguide 124 to form a U-turn SOA 10-4.

The gain waveguides G1 to G8 may be tilted at a predetermined angle @tut with respect to the input/output edge of the substrate 101 to prevent reflection at the end faces. An antireflective coating may be applied to the end faces.

By adopting this layout design of U-turn SOAs, intersection or redundancy of the optical waveguides is reduced in the photonic IC when the integrated photonic device 100 is mounted on the photonic IC, as will be described later.

<Basic Structure of Photonic IC>

Figure 5:
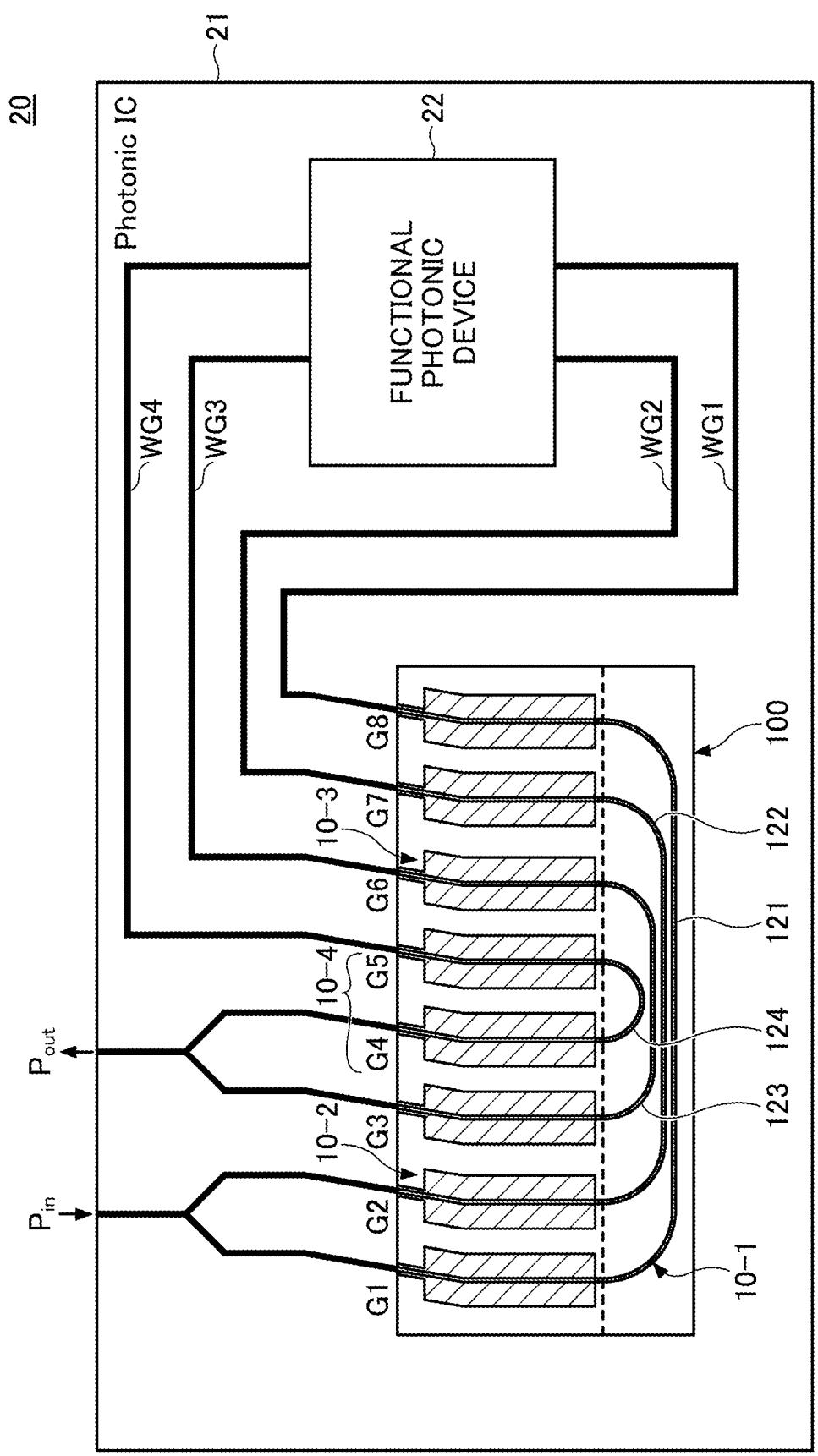
FIG. 5 illustrates a basic configuration of a photonic IC using the integrated photonic device of FIG. 4.

FIG. 5 is a schematic diagram illustrating the basic structure of a photonic IC 20 according to an embodiment. The photonic IC 20 includes an integrated photonic device 100 and a functional photonic device 22. The integrated photonic device 100 and the functional photonic device 22 are connected by optical waveguides WG1 to WG4 formed on the substrate 21. The photonic IC 20 has an optical input port $P_{in}$, for inputting light to the photonic IC 20, and an optical output port $P_{out}$ for outputting light from the photonic IC 20.

The integrated photonic device 100 may be the same one as that illustrated in FIG. 4, where two gain regions are selected from the outermost or the innermost of the array, and the respective pairs of the gain regions are connected by connecting waveguides 121 to 124 to form U-turn SOA 10-1 to 10-4.

The light input from the optical input port $P_1$, to the photonic IC 20 is split into two and input to the gain waveguide G1 of the input side of the U-turn SOA 10-1 and the gain waveguide G2 of the input side of the U-turn SOA 10-2. The split light components are amplified by the U-turn SOA 10-1 and 10-2, and output from the gain waveguides G8 and G7, respectively.

The amplified light components are supplied to the functional photonic device 22 through the optical waveguides WG1 and WG2 formed in the photonic IC 20. The light components output from the functional photonic device 22 are incident, through the optical waveguides WG3 and WG4, onto the gain waveguide G6 of the input side of the U-turn SOA 10-3 and the gain waveguide G5 of the input side of the U-turn SOA 10-4.

The light components amplified by the U-turn SOA 10-3 and the U-turn SOA 10-4 are output from the gain waveguides G3 and G4, respectively, and are combined and output from the optical output port $P_{out}$.

There is no intersection occurring in the optical waveguide extending between the input port $P_{in}$ and the integrated photonic device 100, the optical waveguide extending between the integrated photonic device 100 and the output port $P_{out}$, or the optical waveguides WG1 to WG4, achieving simple wiring.

The two split input lights are amplified by the integrated photonic device 100 and supplied to the functional photonic device 22. The lights output from the functional photonic device 22 are amplified again by the integrated photonic device 100 and externally output from the output port $P_{out}$.

In this configuration, optical amplification is performed at both the input side and the output side of the functional photonic device 22. As will be described later, optical amplification may be performed at only one of the input side or the output side of the functional photonic device 22. In the latter case, the number of U-turn SOAs 10 integrated onto the integrated photonic device 100 is two, and the layout of the optical waveguides WG on the photonic IC becomes simpler.

First Embodiment

Figure 6:
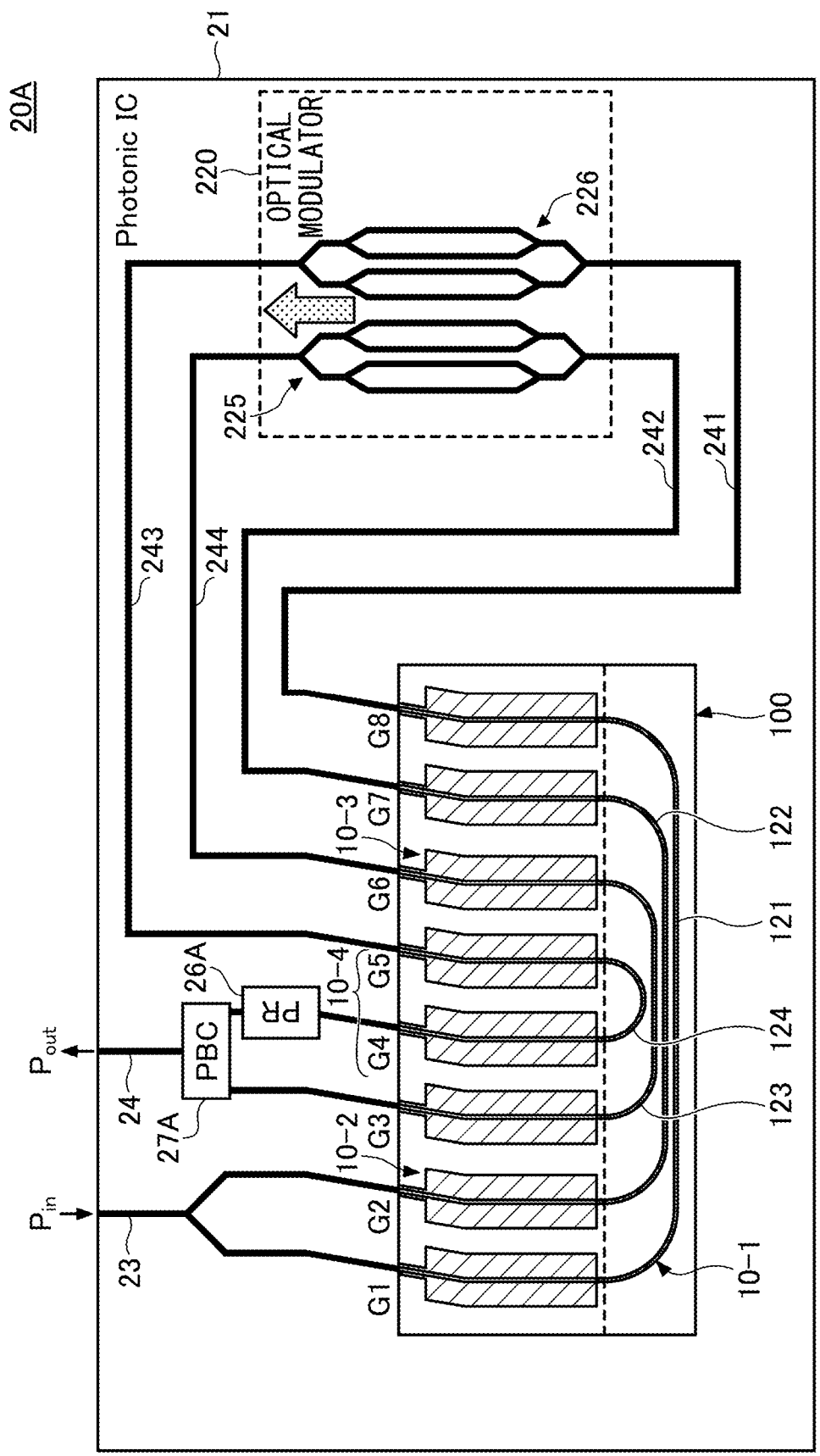
FIG. 6 is a schematic diagram of a photonic IC according to the first embodiment.

FIG. 6 is a schematic diagram of a photonic IC 20A according to the first embodiment. In the first embodiment, a DP-QPSK optical modulator 220 is used as the functional photonic device 22. An integrated photonic device 100 with four U-turn SOAs 10-1 to 10-4 arranged in an array is used to perform optical amplification on the input side and the output side of the optical modulator 220. The integrated photonic device 100 may be the same one as that illustrated in FIG. 5. The same elements as those in FIG. 5 are denoted by the same reference numerals, and redundant description may be omitted.

The optical modulator 220 is a DP-IQ modulator in which an IQ modulator 225 and an IQ modulator 226 are arranged in parallel. The photonic IC 20A can be used as a DP-IQ modulator module.

The substrate 21 is, for example, a silicon-on-insulator (SOI) substrate. The optical waveguides and the optical modulator 220 provided on the substrate 21 may be formed by silicon photonics technology. An optical input port $P_{in}$ and an optical output port $P_{out}$ are provided on an edge of the optical IC 20A.

The light input from the optical input port $P_{in}$ to the input waveguide 23 of the photonic IC 20A is split into two by a 1×2 optical coupler or the like. One of the split light components is input to the gain waveguide G1 located on the input side of the U-turn SOA 10-1. The other of the split light components is input to the gain waveguide G2 located on the input side of the U-turn SOA 10-2. The split light components are amplified by the U-turn SOA 10-1 and 10-2, respectively, and output from the gain waveguides G8 and G7.

The light output from the gain waveguide G8 is incident on the IQ modulator 226 of the optical modulator 220 through the optical waveguide 241. The light output from the gain waveguide G7 is incident on the IQ modulator 225 through the optical waveguide 242.

The light components modulated at the IQ modulators 225 and 226 have the same polarization. The polarization plane of one of the two modulated light components is rotated by 90 degrees before the two light components are combined. In this sense, one of the IQ modulators 225 and 226 may be called a TE-mode IQ modulator, and the other may be called a TM-mode IQ modulator.

The light component modulated by the IQ modulator 225 is input to the gain waveguide G6 of the U-turn SOA 10-3 through the optical waveguide 244, and is amplified and output from the gain waveguide G3. The light component modulated by the IQ modulator 226 is input to the gain waveguide G5 of the U-turn SOAQ 10-4 through the optical waveguide 243, and is amplified and output from the gain waveguide G4.

The polarization plane of the light component output from the gain waveguide G4 is rotated by 90 degrees at PR 26A. Then, this light component is combined with the other light component output from the gain waveguide G3 at the PBC 27A. The combined light travels through the output waveguide 24 and is output as a DP-QPSK modulated signal from the output port $P_{out}$.

By using the integrated photonic device 100, the photonic IC 20A can apply a functional process to the input light, and output the processed light without causing intersections or redundancy in the optical waveguides.

With the photonic IC 20A, light can be independently amplified on the input side and the output side of the optical modulator 220. In some cases, it is more advantageous to amplify the light at multiple stages to distribute the load, rather than amplifying the light once at a single site on the photonic IC 20. From the viewpoint of reducing power consumption and suppressing noise, load distribution type configurations can be adopted, although the number of U-turn SOAs 10 formed in the integrated photonic device 100 may increase.

The drive current may be different between the U-turn SOAs located on the input side and the output side of the optical modulator 220. If a current is injected simultaneously into the multiple U-turn SOAs 10 arranged in parallel in an array to drive the SOAs of the integrated photonic device 100, the temperature tends to rise at the inner U-turn SOAs due to heat dissipation. Accordingly, the drive currents for the U-turn SOAs 10-1 and 10-2 located at outer positions in the array may be set greater than the drive currents for the inner U-turn SOAs 10-3 and 10-4.

In this case, the optical amplification on the input side of the photonic IC 20A is greater than the optical amplification on the output side. Because the light components incident onto the IQ modulators 225 and 226 have sufficient power, the modulated light components output from the IQ modulators 225 and 226, respectively, also have sufficient power. There is no disadvantage even if the drive currents for the inner U-turn SOAs 10-3 and 10-4 are set smaller than those for the outer U-turn SOAs 10-1 and 10-2. The power of the modulated light components input to the U-turn SOAs 10-3 and 10-4 are sufficiently high, compared with the noise level. By appropriately amplifying the modulated light components, in which noise is relatively low, at the output stage of the integration photonic device, a modulated optical signal that satisfies a low-noise characteristic can be output from the photonic IC 20A.

The configuration of FIG. 6 is suitable to applications that require low-noise characteristics of optical signals. No intersection or redundancy occurs in the optical waveguide on the photonic IC 20A, and high-quality optical output can be achieved with a simple layout.

Second Embodiment

Figure 7:
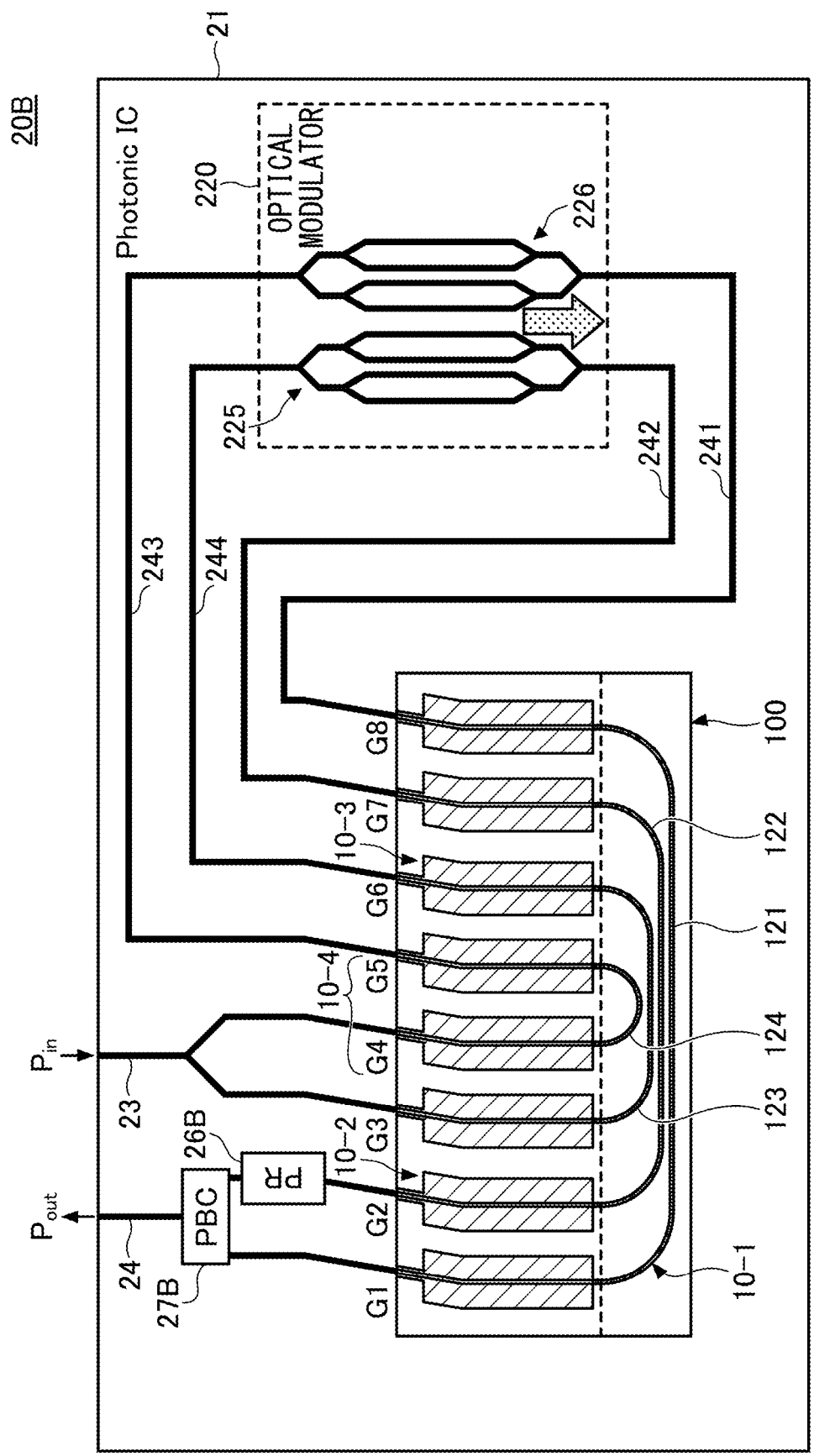
FIG. 7 is a schematic diagram of a photonic IC according to the second embodiment.

FIG. 7 is a schematic diagram of a photonic IC 20B according to the second embodiment. In the above-described first embodiment, the outer U-turn SOAs 10-1 and 10-2 of the integrated photonic device 100 are used to amplify the light components at the input side of the photonic IC 20A. In the second embodiment, the optical output port $P_{out}$ is arranged at an outer side of the input port $P_{in}$ along the edge of the substrate 21, and optical amplification performed at the output stage of the photonic IC 20B is enhanced.

The structure of the integrated photonic device 100 itself is the same as those illustrated in FIG. 5 and FIG. 6. The elements are denoted by the same reference numerals, and redundant description may be omitted.

The light input from the optical input port $P_{in}$ to the input waveguide 23 of the photonic IC 20B is split into two by a 1×2 optical coupler or the like. One of the two split light components is input to the gain waveguide G3 located on the input side of the U-turn SOA 10-3. The other of the two split light components is input to the gain waveguide G4 located on the input side of the U-turn SOA 10-4. The split light components are amplified by the inner U-turns SOAs 10-3 and 10-4, and output from the gain waveguides G6 and G5, respectively.

The light component output from the gain waveguide G6 is incident onto the IQ modulator 225 of the optical modulator 220 through the optical waveguide 244. The light component output from the gain waveguide G5 is incident onto the IQ modulator 226 through the optical waveguide 243.

The light component modulated by the IQ modulator 225 is input to the gain waveguide G7 of the U-turn SOA 10-2 through the optical waveguide 242, and is amplified and output from the gain waveguide G2. The light component modulated by the IQ modulator 226 is input to the gain waveguide G8 of the U-turn SOA 10-1 through the optical waveguide 241, and is amplified and output from the gain waveguide G1.

The polarization plane of the light component output from the gain waveguide G2 is rotated by 90 degrees at PR 26B. Then, the polarization rotated light component is combined with the other light component output from the gain waveguide G1 at the PBC 27B. The combined light travels through the output waveguide 24 and is output as a DP-QPSK modulated signal from the output port $P_{out}$.

By using the integrated photonic device 100, the photonic IC 20B can apply a functional process to the input light, and output the processed light without causing intersections or redundancy in the optical waveguides.

With the photonic IC 20B, the drive currents of the outer U-turn SOAs 10-1 and 10-2 in the array may be set greater than the drive currents of the inner U-turn SOAs 10-3 and 10-4. In this case, the optical amplification performed at the output stage of the photonic IC 20B is greater than the optical amplification performed at the input stage.

The configuration of FIG. 7 is suitable to applications that require higher output levels at the output stage of the photonic IC 20B. Because high power output can be achieved at the output side of the photonic IC 20B, a high-power optical signal is output from the photonic IC 20B.

Third Embodiment

Figure 8:
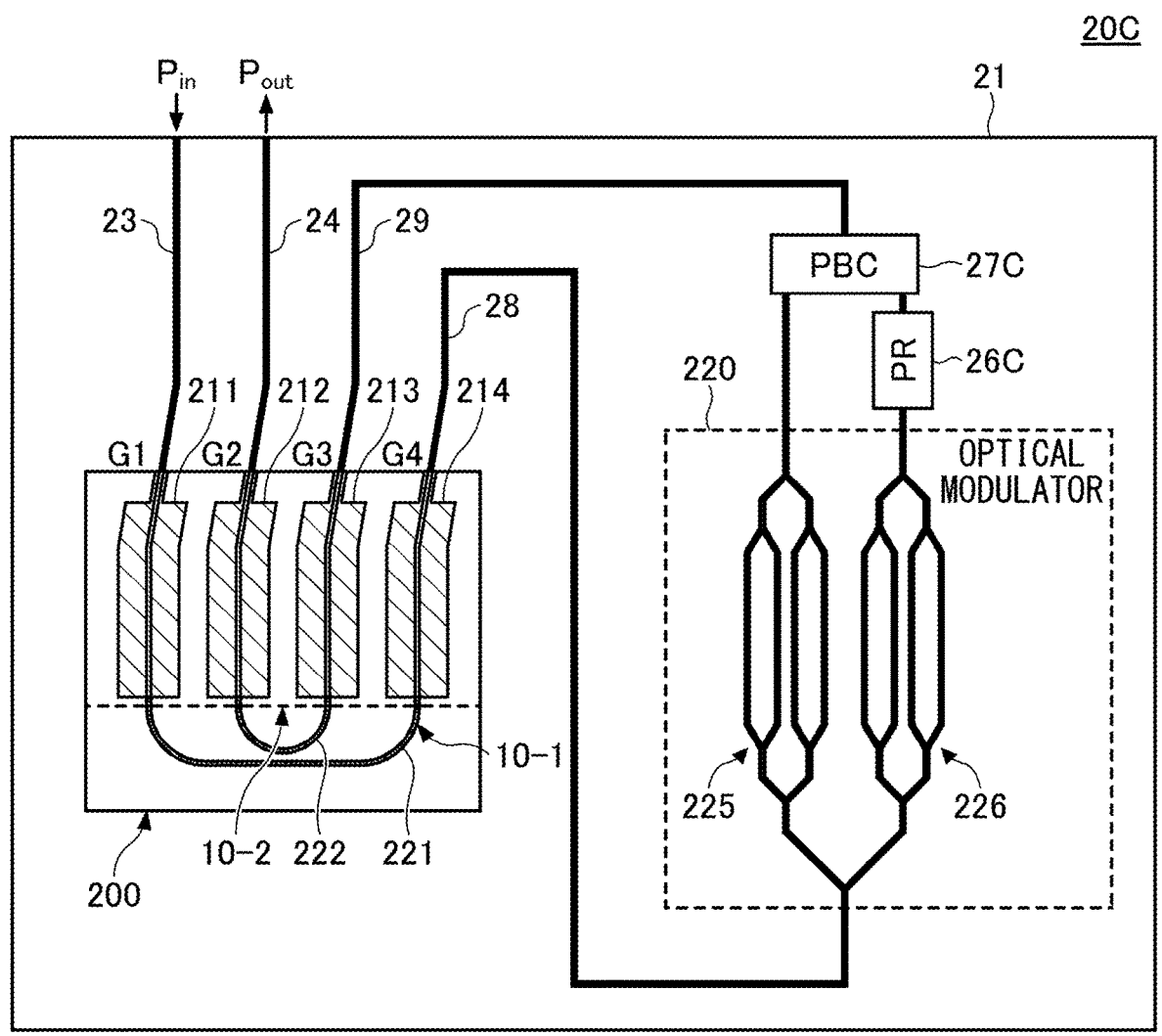
FIG. 8 is a schematic diagram of a photonic IC according to the third embodiment.

FIG. 8 is a schematic diagram of the photonic IC 20C according to the third embodiment. In the third embodiment, an integrated photonic device 200 having an array of two U-turn SOAs 10-1 and 10-2 is used to amplify the light input to and output from the optical modulator 220 which serves as the functional photonic device.

The outer U-turn SOA 10-1 has a gain region 211 including a gain waveguide G1, a gain region 214 including a gain waveguide G4, and a connecting waveguide 221 that connects the gain waveguides G1 and G4. The inner U-turn SOA 10-2 has a gain region 212 including a gain waveguide G2, a gain region 213 including a gain waveguide G3, and a connecting waveguide 222 that connects the gain waveguides G2 and G3.

The optical input port $P_{in}$ is connected to the outer U-turn SOA 10-1 of the integrated photonic device 200 to enhance the optical amplification performed at the input stage.

The light input from the optical input port $P_{in}$ to the input waveguide 23 of the photonic IC 20C is input to the gain waveguide G1 located at the input side of the U-turn SOA 10-1, and is amplified and output from the gain waveguide G4 of the U-turn SOA 10-1.

The light output from the gain waveguide G4 is guided to the light modulator 220 through the optical waveguide 28 and split into two by a 1×2 optical coupler or the like. One of the two split light components is incident on the IQ modulator 225 and the other is incident on the IQ modulator 226.

The polarization plane of one of the two light components output from the IQ modulators (for example, the light component output from the IQ modulator 226) is rotated by 90 degrees at the PR 26C. The polarization-rotated light component is then combined with the other light component output from, for example, the IQ modulator 225, at the PBC 27C. The combined modulated light is input to the gain waveguide G3 of the U-turn SOA 10-2 through the optical waveguide 29, and is amplified and output from the gain waveguide G2. The light amplified by the U-turn SOA 10-2 is output as a DP-QPSK modulated signal from the output port $P_{out}$ through the output waveguide 24.

Because the number of U-turn SOAs formed in the integrated photonic device 200 is small, heat distribution is substantially uniformed over the integrated photonic device 200. The amplification load is distributed on the photonic IC 20C, while the chip size of the integrated photonic device 200 is halved.

In the integrated photonic device 200, the drive current of the outer U-turn SOA 10-1 may be set greater than the drive current of the inner U-turn SOA 10-2. In this case, the optical amplification performed at the input stage of the photonic IC 20B is greater than the optical amplification performed at the output stage of the photonic IC 20B, and low-noise characteristics of the optical output signal can be achieved.

Using the integrated photonic device 200, a simple layout of optical wiring is achieved, without causing intersections or undesirable redundancy in the optical waveguides.

Fourth Embodiment

Figure 9A:
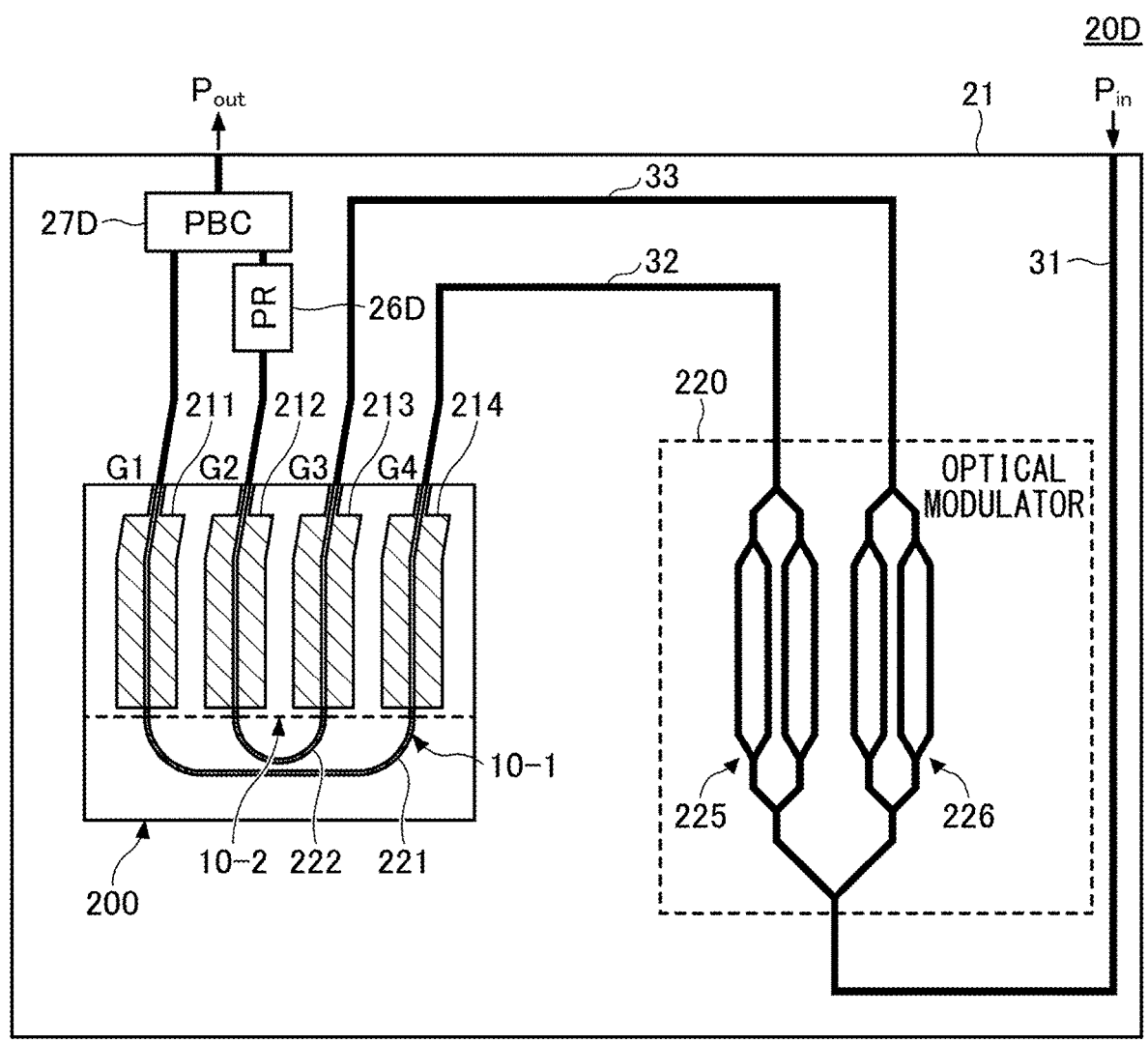
FIG. 9A is a schematic diagram of a photonic IC according to the fourth embodiment.

FIG. 9A is a schematic diagram of a photonic IC 20D according to the fourth embodiment. In the fourth embodiment, optical amplification is performed only at the output stage of the photonic IC 20D, using the integrated photonic device 200 having an array of the U-turn SOAs 10-1 and 10-2. The structure of the integrated photonic device 200 itself is the same as that illustrated in FIG. 8. The same elements as those in FIG. 8 are denoted by the same reference numerals, and redundant description may be omitted.

The light input from the optical input port $P_{in}$ to the input waveguide 31 of the photonic IC 20D is incident on the optical modulator 220. The light incident on the optical modulator 220 is split into two by a 1×2 optical coupler or the like. The two split light components are modulated by the IQ modulators 225 and 226, respectively. The light component modulated by the IQ modulator 225 is input to the gain waveguide G4 through the optical waveguide 32 and amplified by the U-turn SOA 10-1. The light component modulated by the IQ modulator 226 is input to the gain waveguide G3 through the optical waveguide 33 and amplified by the U-turn SOA 10-2.

The polarization plane of the amplificated light component output from the gain waveguide G2 of the U-turn SOA 10-2 is rotated by 90 degrees at the PR 26D, and is combined with the other amplified light component output from the gain waveguide G1 at the PBC 27D. The combined light is output as a DP-QPSK signal from the output port $P_{out}$.

Because, in the integrated photonic device 200, the number of U-turn SOAs is small, the heat distribution on the integrated photonic device 200 is uniform, compared with the integrated photonic device 100. The amplification load is distributed over the photonic IC 20C, while the chip size of the integrated photonic device 200 is halved.

By using the integrated photonic device 200, the photonic IC 20D has a simple layout of optical wiring, without intersections or unnecessary redundancy in the optical waveguides. The configuration of FIG. 9A is suitable for applications that require high-output characteristics, because the modulated optical signal is sufficiently amplified at the output stage of the photonic IC 20D.

Figure 9B:
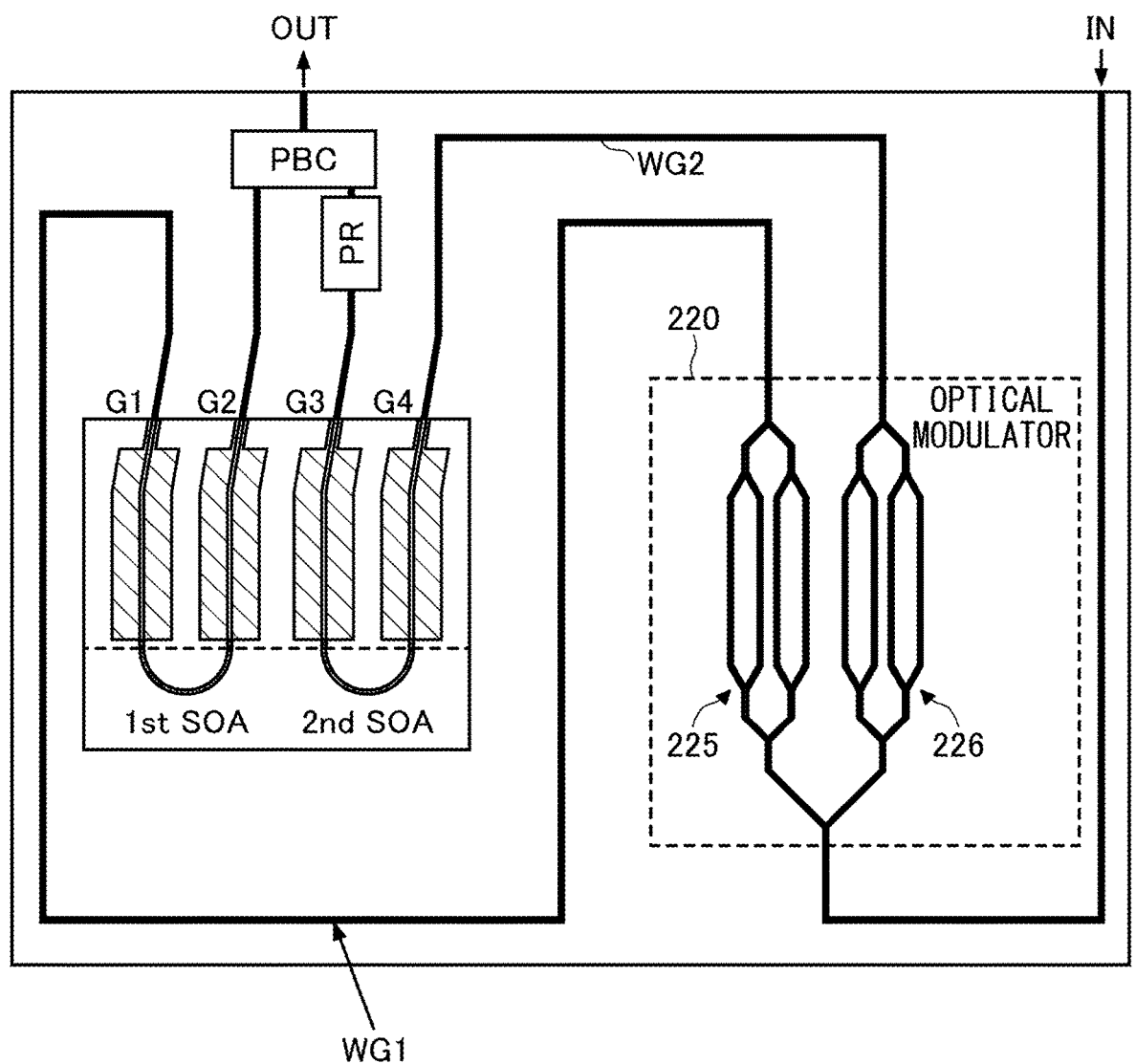
FIG. 9B illustrates a comparative configuration using a conventional integrated photonic device, where some drawbacks arise.

FIG. 9B illustrates a comparative configuration of wiring design in which a conventional U-turn SOA array is used as the integrated photonic device. Optical amplification is performed only at the output side of the optical modulator 220, as in FIG. 9A.

In FIG. 9B, two adjacent gain regions are connected by a U-shaped optical wiring to form each of the first SOA and the second SOA. The light modulated by the IQ modulator 225 is input to the gain waveguide G1 of the first SOA through the optical waveguide WG1 and amplified. The light modulated by the IQ modulator 226 is input to the gain waveguide G4 of the second SOA through the optical waveguide WG2 and amplified.

In the conventional configuration of FIG. 9B, the routing of the optical waveguide WG1 is considerably long, and optical loss occurs. In contrast, with the configuration of FIG. 9A, the optical waveguides 32 and 33 extending between the optical modulator 220 and the integrated photonic device 200 are parallel to each other, and there is little difference in the waveguide length. Not only noise and optical loss can be suppressed, but also a simple wiring layout with less delay is achieved.

Fifth Embodiment

Figure 10:
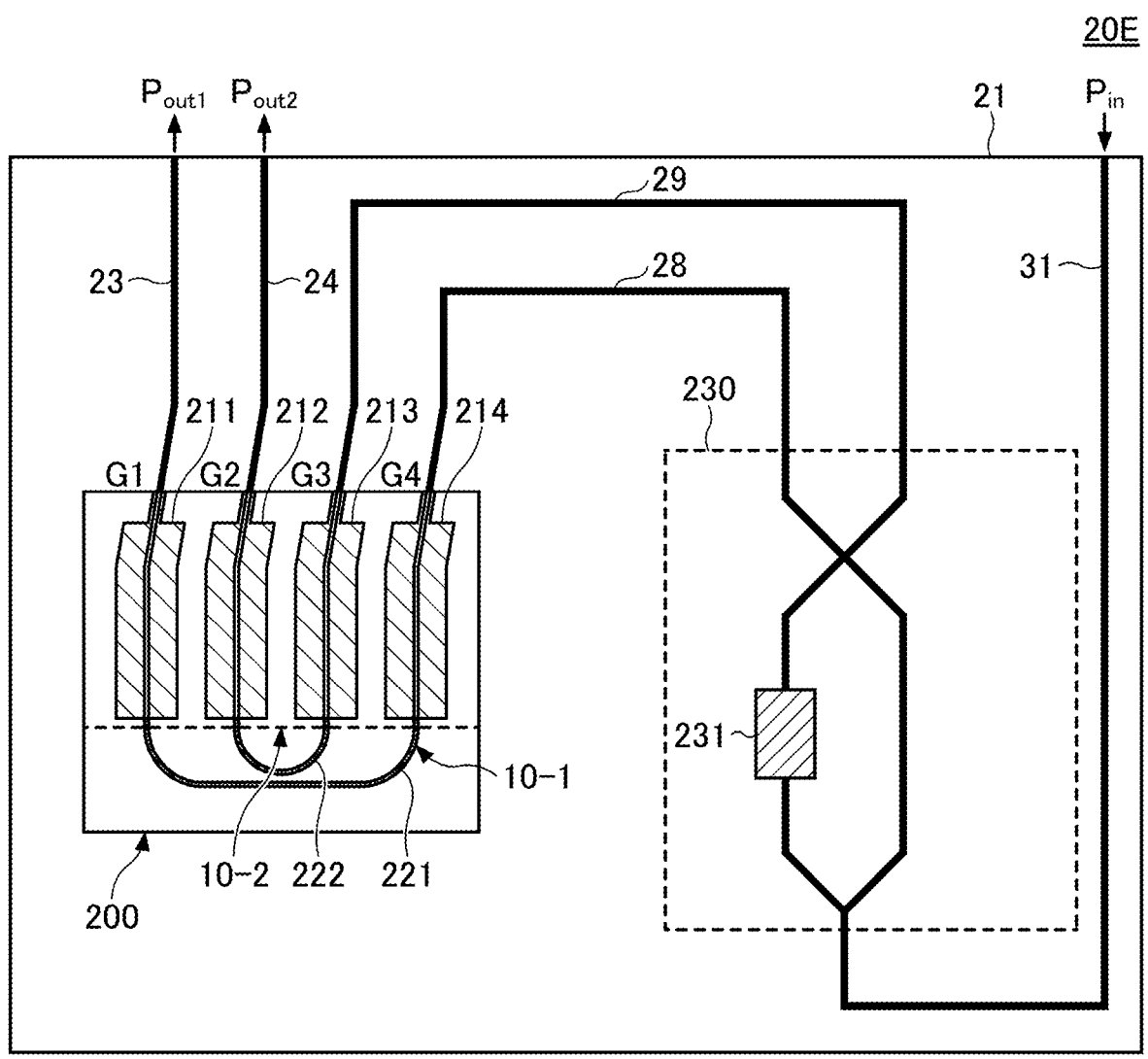
FIG. 10 illustrates a circuit layout of the photonic IC of the fifth embodiment.

FIG. 10 is a schematic diagram of a photonic IC 20E according to the fifth embodiment. An optical switch 230 of an MZ interferometer type is used as the functional photonic device. The integrated photonic device 200 is the same one as those illustrated in FIG. 8 and FIG. 9A. The same elements are denoted by the same reference numerals, and redundant description may be omitted.

The light input from the optical input port $P_{in}$ to the input waveguide 31 of the photonic IC 20E is incident on the optical switch 230. The light incident on the optical switch 230 is split into two at a 50/50 split ratio by a 1×2 optical coupler or the like.

When the heater 231 of the optical switch 230 is in the OFF state, the two light components constructively interfere each other at the 2×2 optical coupler (or multimode interferometer), and 100% of the light components is output to the optical waveguide 28. When the heater 231 is in the ON state, the speed of the light component travelling through the waveguide provided with the heater 231 decreases, and the optical phases of the light components combined at the 2×2 optical coupler are offset from each other. The light with a certain phase difference is output to the optical waveguide 29.

The light output to the optical waveguide 28 is amplified by the U-turn SOA 10-1 and output from the first output port $P_{out1}$. The light output to the optical waveguide 29 is amplified by the U-turn SOA 10-2 and output from the second output port $P_{out2}$.

The optical switch 230 can switch in a stable manner between the optical outputs, simply by controlling the power supplied to the heater 231. The ON/OFF timing of the heater 231 may be synchronized with the switching of the current injection into the U-turn SOA 10-1 and 10-2 of the integrated photonic device 200.

Because, in the integrated photonic device 200, the number of U-turn SOAs is small, the heat distribution on the integrated photonic device 200 is substantially uniform, compared with the integrated photonic device 100. The amplification load is distributed over the photonic IC 20E, while the chip size of the integrated photonic device 200 is halved.

By using the integrated photonic device 200, the optical waveguides 28 and 29 are arranged with a simple layout and a reduced propagation length, and there is almost no delay difference between the optical waveguides 28 and 29. Optical path switching is achieved with less noise and less optical loss. This configuration is suitable to optical switching where high output is required.

Sixth Embodiment

Figure 11:
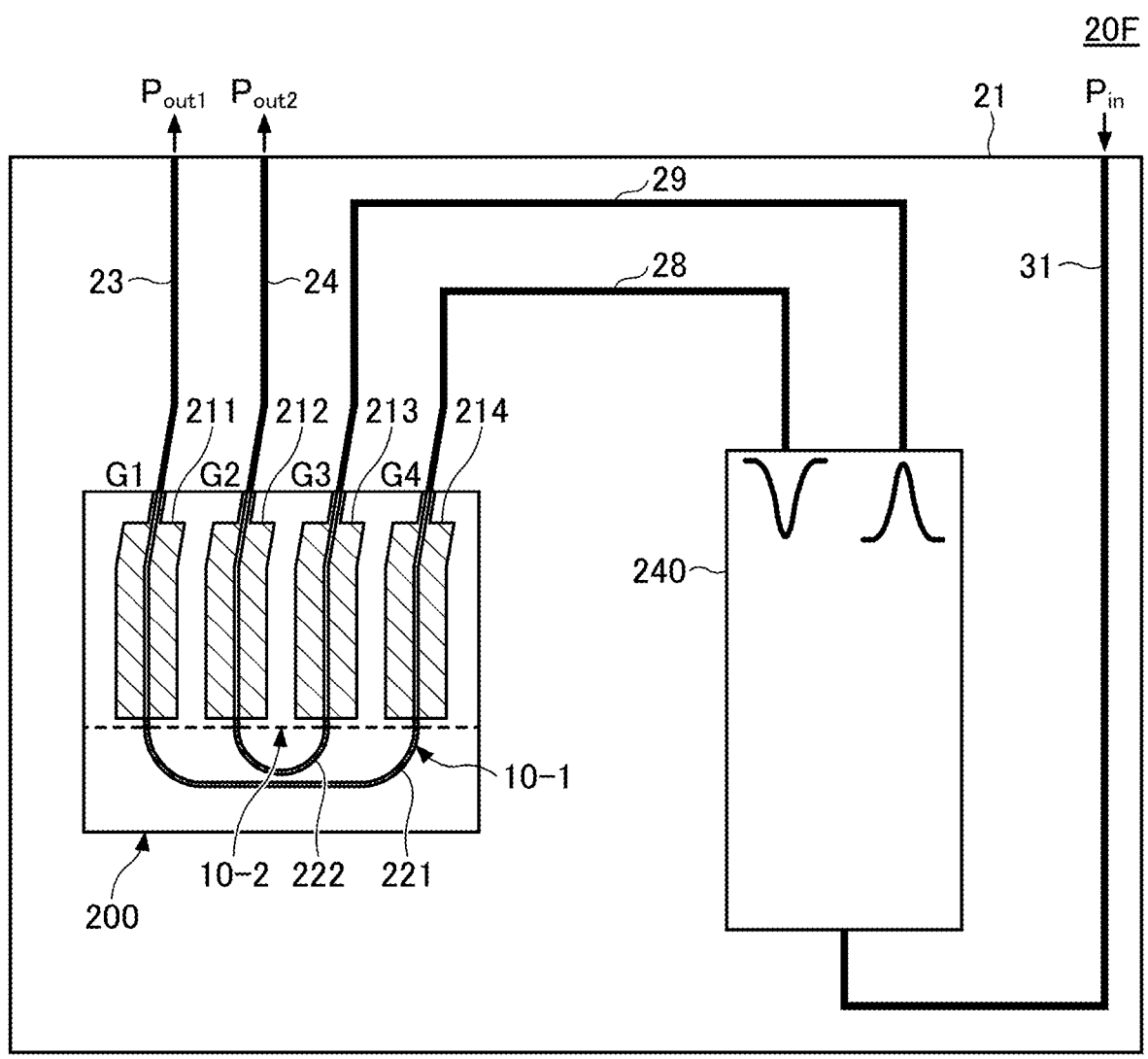
FIG. 11 illustrates a circuit layout of the photonic IC of the sixth embodiment.

FIG. 11 is a schematic diagram of a photonic IC 20F according to the sixth embodiment. The structure of the integrated photonic device 200 is the same as those illustrated in FIG. 8 and FIG. 9. The same elements are denoted by the same reference numerals, and redundant description may be omitted.

The light input from the optical input port $P_{in}$ to the input waveguide 31 of the photonic IC 20F is incident on the optical drop filter 240. The incident light includes, for example, two light components with different wavelengths. Because the effective path length varies depending on the wavelength, the light components are focused at different positions of the output end of the optical drop filter 240. By connecting the optical waveguides 28 and 29 to the focusing positions of the respective wavelengths, the light components with different wavelengths can be demultiplexed.

The light of the first wavelength is incident on the optical waveguide 29, but is reflected at the position connected to the optical waveguide 28. The light of the first wavelength is guided to the U-turn SOA 10-2 through the optical waveguide 29, and is amplified and output from the second output port $P_{out2}$. The light of the second wavelength is focused at the position connected to the optical waveguide 28. The light of the second wavelength is guided to the U-turn SOA 10-1 through the optical waveguide 28, and is amplified and output from the first output port $P_{out}$.

The first output port $P_{out1}$ may be used as a drop port, and the second output port $P_{out2}$ may be used as a through port. By using the integrated photonic device 200, the optical waveguides 28 and 29 are arranged with a simple layout and a reduced propagation length, and there is almost no delay difference between the optical waveguides 28 and 29. Optical channel dropping or wavelength separation can be achieved with less noise and less optical loss.

Although the present disclosure has been described based upon specific embodiments, the present disclosure is not limited to the particular configurations described above. The connecting waveguides 121 to 124, and connecting waveguides 221 and 222 may be shaped in an appropriate form such as an arc, a semicircle, or a horseshoe, as long as the SOA with two gain regions is bent or folded back using a connecting waveguide. Two or more of the first to sixth embodiments can be combined with each other. For example, in the configuration of FIG. 8, the optical output port $P_{out}$ may be provided on the outer side of the optical input port $P_{in}$, such that the light input to the optical modulator is amplified by the inner U-turn SOA 10-2 driven at a lower current, and that a high-output configuration is achieved.

The optical modulator is not limited to a DP-QPSK modulator, and it may employ another modulation scheme, such as pulse amplitude modulation (PAM). The functional photonic device is not limited to a single optical switch or a single drop filter. The functional photonic device may be configured as an integrated photonic device in which a plurality of functional photonic devices such as optical switches or optical filters are integrated on a substrate. The integrated photonic device 100 or 200 of the embodiments may be a silicon photonics chip in which silicon waveguides are formed as the connecting waveguides by a silicon photonics technology, and in which multiple SOAs are flip-chip mounted on the silicon substrate such that pairs of the gain regions are connected by the associated connecting waveguides.

In such substitutions or alterations, intersections or redundancy in optical waveguides can be prevented using the integrated photonic device 100 or 200, thereby reducing noise due to crosstalk or reducing optical loss due to redundant waveguides. By forming a U-turn SOA array as the integrated photonic device 100, the manufacturing cost of the integrated photonic device, and assembling cost for incorporating the integrated photonic device 100 into the photonic IC can be reduced. The sizes of the integrated photonic device and the photonic IC can be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present inventions have been described in detail, it should be understood that the various changes, substitutions, and alterations could be made hereto without departing from the spirit and scope of the invention.

What is claimed is:

1. An integrated photonic device having an array of two or more semiconductor optical amplifiers, comprising:
   a first semiconductor optical amplifier having a first gain region and a second gain region connected by a first connecting waveguide; and
   a second semiconductor optical amplifier provided in parallel with the first semiconductor optical amplifier and having a third gain region and a fourth gain region connected by a second connecting waveguide,
   wherein the first gain region and the second gain region define a first gain region pair, and the third gain region and the fourth gain region define a second gain region pair, the second gain region pair being disposed within the first gain region pair, and
   wherein the first connecting waveguide is configured to connect the first gain region and the second gain region on an outer side of the second connecting waveguide.

2. The integrated photonic device as claimed in claim 1, wherein a first input end and a first output end of the first semiconductor optical amplifier are located at a same side of the array, and a second input end and a second output end of the second semiconductor optical amplifier are located at the same side of the array.

3. The integrated photonic device as claimed in claim 2, wherein the first connecting waveguide is configured to connect the first gain region and the second gain region at a position opposite to the first input end and the first output end, and
   the second connecting waveguide is configured to connect the third gain region and the fourth gain region at a position opposite to the second input end and the second output end.

4. The integrated photonic device as claimed in claim 1, wherein a drive current of the first semiconductor optical amplifier is set greater than a drive current of the second semiconductor optical amplifier.

5. A photonic integrated circuit, comprising:
   a substrate having a light input port and a light output port;
   a functional photonic device formed on the substrate;
   an integrated photonic device mounted on the substrate; and
   optical waveguides formed on the substrate and including
      a first waveguide coupled between the light input port and the integrated photonic device,
      a second waveguide coupled between the light output port and the integrated photonic device, and
      third waveguides coupled between the functional photonic device and the integrated photonic device, wherein the functional photonic device, the integrated photonic device, and the light output port are configured without intersection, wherein the integrated photonic device has an array of two or more semiconductor optical amplifiers, and includes a first semiconductor optical amplifier having a first gain region and a second gain region connected by a first connecting waveguide, and a second semiconductor optical amplifier provided in parallel with the first semiconductor optical amplifier and having a third gain region and a fourth gain region connected by a second connecting waveguide, and wherein the first gain region and the second gain region define a first gain region pair, and the third gain region and the fourth gain region define a second gain region pair, the second gain region pair being disposed within the first gain region pair, and the first connecting waveguide is configured to connect the first gain region and the second gain region on an outer side of the second connecting waveguide.

6. The photonic integrated circuit as claimed in claim 5, wherein the light input port is connected to a first input end of the first semiconductor optical amplifier located at an outer position in the array, and a first output end of the first semiconductor optical amplifier is connected to an input of the functional photonic device, and wherein the light output port is connected to a second output end of the second semiconductor optical amplifier located at an inner position in the array, and a second input end of the second semiconductor optical amplifier is connected to an output of the functional photonic device.

7. The photonic integrated circuit as claimed in claim 5, wherein the light input port is connected to a second input end of the second semiconductor optical amplifier located at an inner position in the array, and a second output end of the second semiconductor optical amplifier is connected to an input of the functional photonic device, and wherein the light output port is connected to a first output end of the first semiconductor optical amplifier located at an outer position in the array, and a first input end of the first semiconductor optical amplifier is connected to an output of the functional photonic device.

8. The photonic integrated circuit as claimed in claim 5, wherein the light input port is connected to an input of the functional photonic device, and the integrated photonic device is connected to an output of the functional photonic device.

9. The photonic integrated circuit as claimed in claim 8, further comprising:

a first output port connected to a first output of the first semiconductor optical amplifier; and a second output port connected to a second output of the second semiconductor optical amplifier.

* * * * *